(12) United States Patent
Lu et al.

(10) Patent No.: US 7,884,378 B1
(45) Date of Patent: Feb. 8, 2011

(54) LIGHT EMITTING DIODE PACKAGE STRUCTURE AND LEAD FRAME STRUCTURE THEREOF

(75) Inventors: Fu-Cai Lu, Taoyuan County (TW); Chun-Wei Su, Taipei (TW); Chien-Lung Tsou, Taoyuan County (TW); Chi-Neng Mo, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 0 days.

(21) Appl. No.: 12/606,182

(22) Filed: Oct. 26, 2009

(30) Foreign Application Priority Data

Aug. 3, 2009 (TW) ............................. 98126057 A

(51) Int. Cl.
*H01L 33/00* (2010.01)

(52) U.S. Cl. .......................... 257/89; 257/99; 257/100; 257/686; 257/696; 257/734; 257/787
(58) Field of Classification Search ................... 257/89, 257/99, 100, 686, 696, 734, 787
See application file for complete search history.

(56) References Cited

U.S. PATENT DOCUMENTS

| | | | |
|---|---|---|---|
| 7,473,933 B2 * | 1/2009 | Yan | 257/88 |
| 2006/0091416 A1 * | 5/2006 | Yan | 257/99 |
| 2007/0165414 A1 * | 7/2007 | Shei et al. | 362/362 |

* cited by examiner

*Primary Examiner*—Long Pham
(74) *Attorney, Agent, or Firm*—Winston Hsu; Scott Margo

(57) ABSTRACT

An LED package structure includes a frame, at least a first LED, and at least a second LED. The frame includes a base having a first cavity and a second cavity, where the second cavity is disposed under the first cavity and the second cavity is smaller than the first cavity. The first LED is disposed in the bottom of the first cavity, and the second LED is disposed in the bottom of the second cavity.

15 Claims, 5 Drawing Sheets

LIGHT EMITTING DIODE PACKAGE STRUCTURE AND LEAD FRAME STRUCTURE THEREOF

BACKGROUND OF THE INVENTION

1. Field of the Invention

The present invention relates to a light-emitting diode (LED) package structure and a frame thereof, and more particularly, to an LED package structure and a frame thereof with a high light-emitting efficiency.

2. Description of the Prior Art

As light-emitting diodes (LEDs) have advantages of low power consumption, long lifetime, small size, high responding speed, high resistance to earthquakes, and an adaptability for mass production, LEDs are widely applied to various illumination lamps as well as electronics products.

FIG. 1 is a schematic diagram of a conventional LED package structure. As shown in FIG. 1, the conventional LED package structure 10 includes a sealant 12, a cavity 14, a plurality of bonding pads 16 disposed in the bottom of the cavity 14, and three low-power LEDs 20 (a red light LED, a green light LED, and a blue light LED) disposed on the plurality of bonding pads 16 and electrically connected to the plurality of bonding pads 16.

The conventional LED package structure 10 contains three low-power LEDs 20 and produces light white by mixing red light, green light, and blue light. However, a light-emitting efficiency of the blue light LED is low, which results in not only a decreased overall luminance but also a decreased overall color purity of the LED package structure 10.

SUMMARY OF THE INVENTION

It is therefore one of the objectives of the present invention to provide an LED package structure and a frame thereof to solve the problems of low light-emitting efficiency and low color purity in the conventional LED package structure.

In accordance with an embodiment of the present invention, an LED package structure is provided, which includes a frame, at least a first LED, and at least a second LED. The frame further includes a base, a plurality of first bonding pads, and a plurality of second bonding pads. The base has a first cavity and a second cavity, wherein the second cavity is disposed under the first cavity and the second cavity is smaller than the first cavity. The plurality of first bonding pads is disposed in the bottom of the first cavity while the plurality of second bonding pads is disposed in the bottom of the second cavity. Additionally, a plurality of first pins is disposed in the base, wherein one end of each of the plurality of first pins extends into the first cavity and is electrically connected to each of the plurality of first bonding pads correspondingly while the other end of each of the plurality of first pins is exposed outside the base. A plurality of second pins is disposed in the base, wherein one end of each of the plurality of second pins extends into the second cavity and is electrically connected to each of the plurality of second bonding pads correspondingly while the other end of each of the plurality of second pins is exposed outside the base.

The LED package structure of the present invention provides a first LED and a second LED exposed in different domains; thus, it will achieve a better heat-dissipation effect and further improve luminance and color purity of the LED package structure.

These and other objectives of the present invention will no doubt become obvious to those of ordinary skill in the art after reading the following detailed description of the preferred embodiment that is illustrated in the various figures and drawings.

DETAILED DESCRIPTION

Certain terms are applied throughout the following description and claims to refer to particular components. As one skilled in the art will appreciate, manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ".

Figure 1:
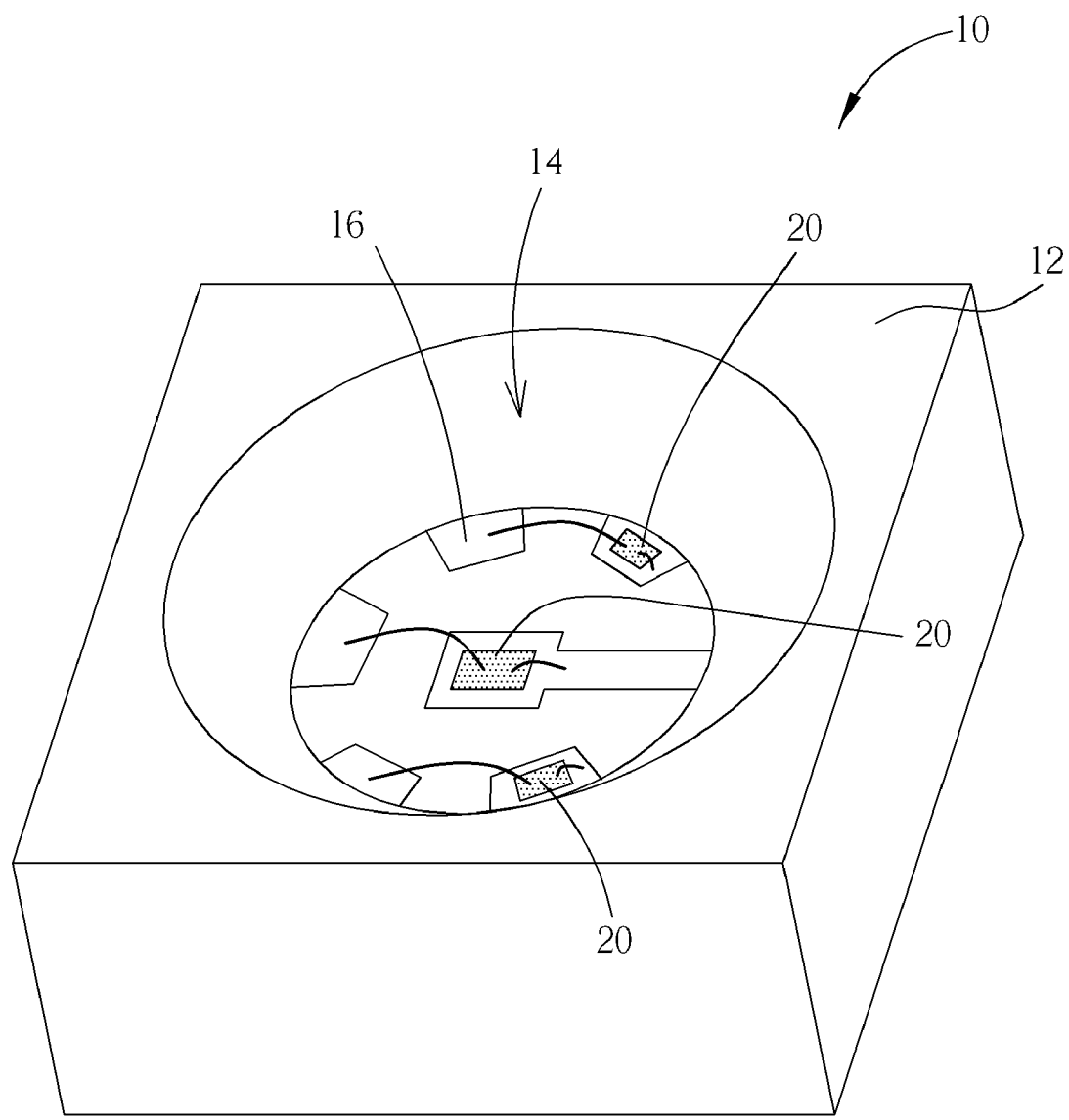
FIG. 1 is a schematic diagram showing a conventional LED package structure.
Figure 2:
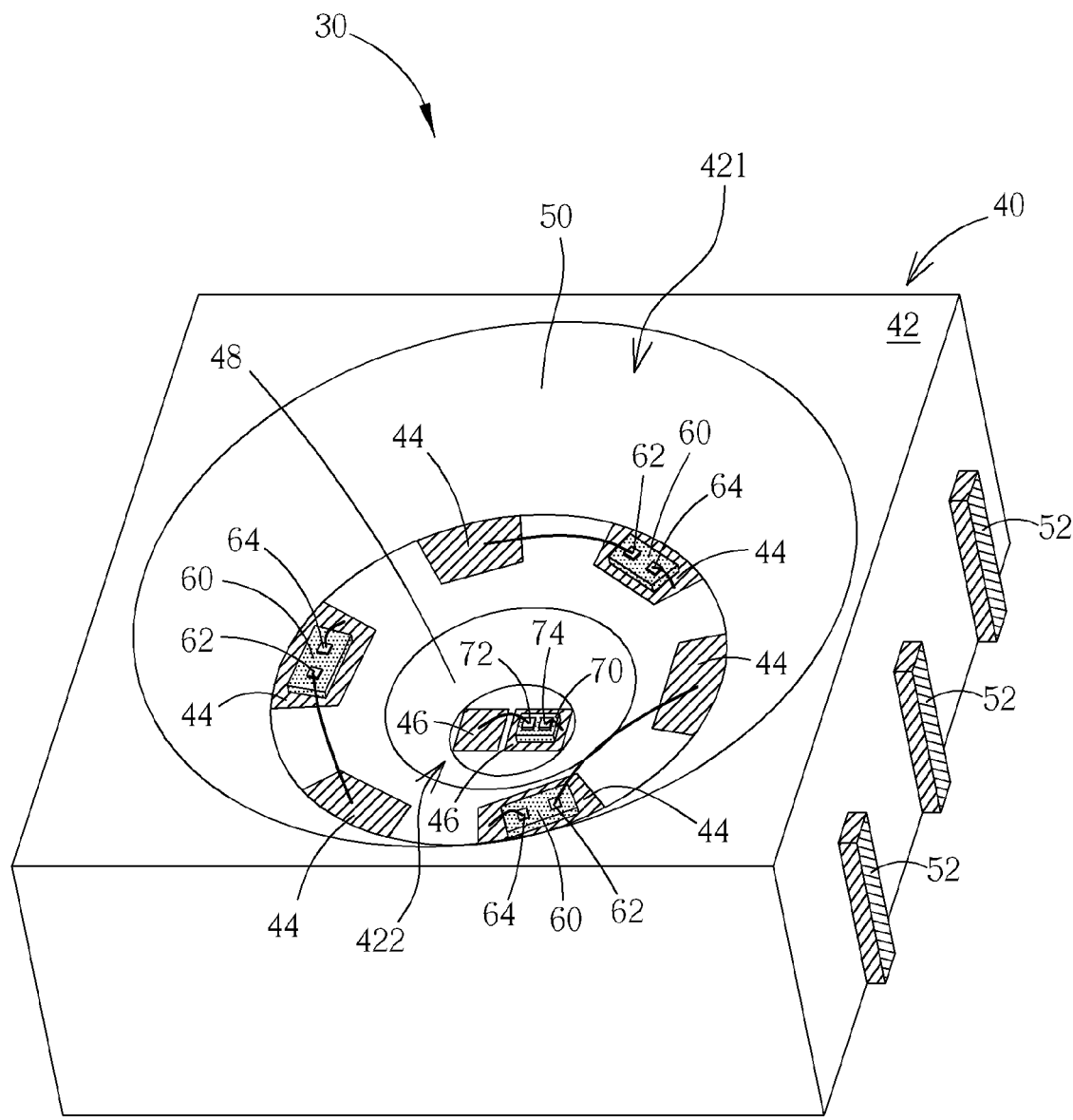
FIG. 2 is a three-dimensional diagram showing an LED package structure according to a preferred embodiment of the present invention.
Figure 3:
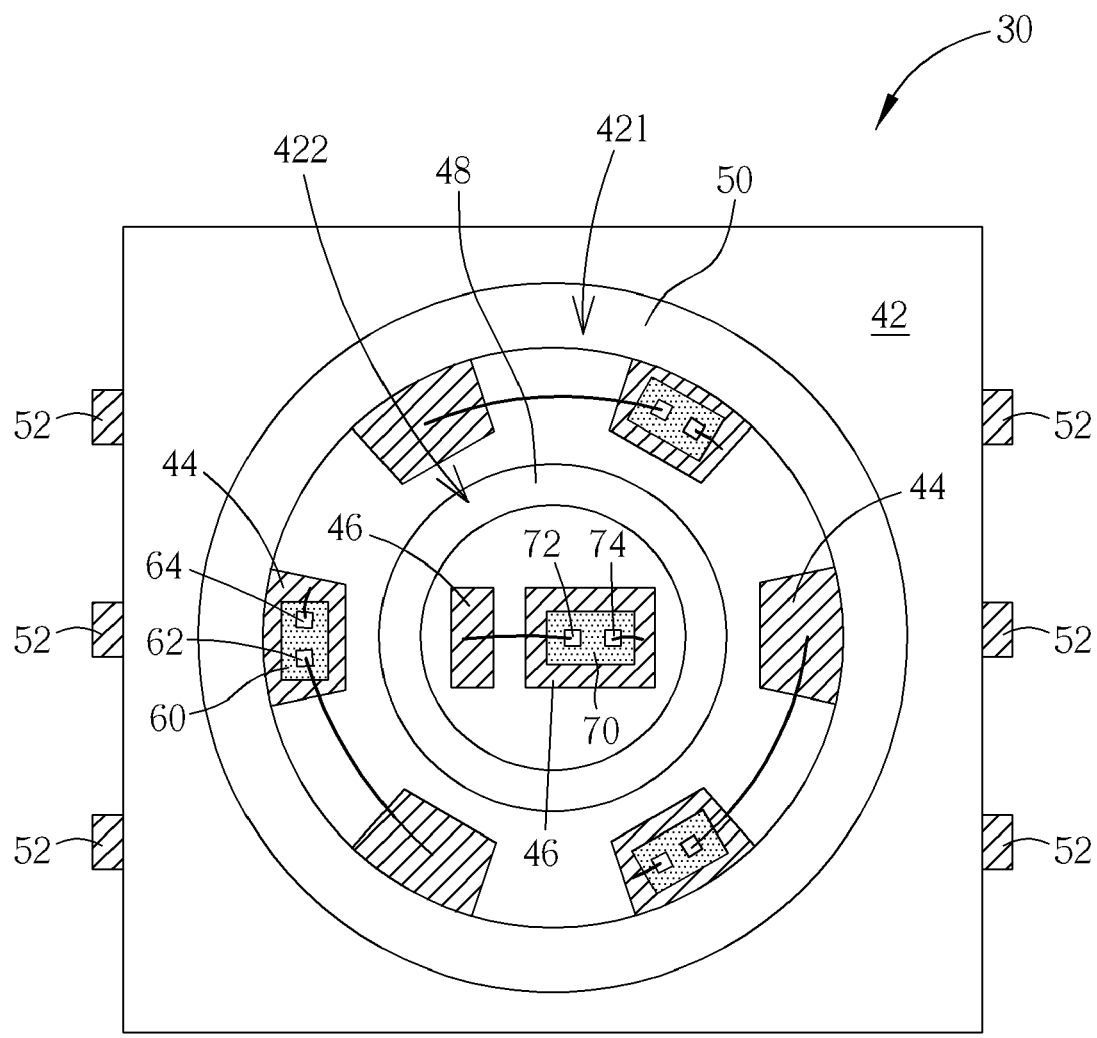
FIG. 3 is a top view showing an LED package structure according to a preferred embodiment of the present invention.
Figure 4:
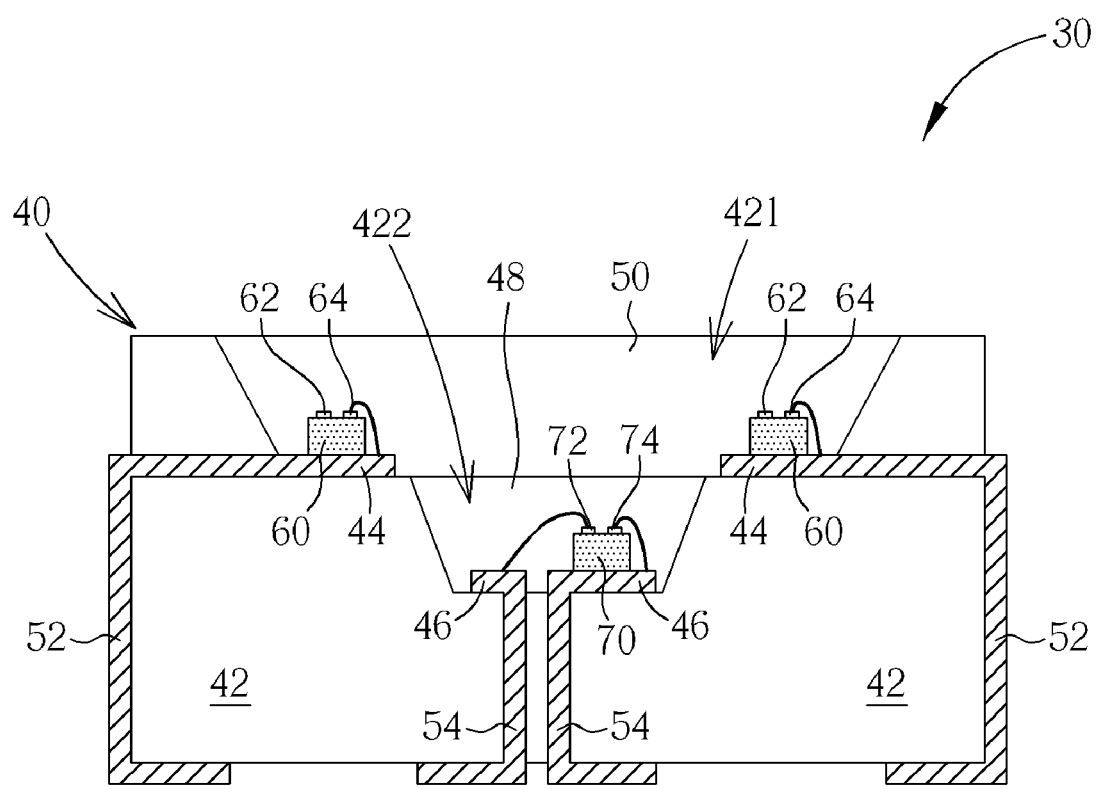
FIG. 4 is a cross-sectional diagram showing an LED package structure according to a preferred embodiment of the present invention.

FIGS. 2 to 5 are schematic diagrams showing an LED package structure according to a preferred embodiment of the present invention. As shown in FIG. 2, an LED package structure 30 of the present embodiment essentially includes a frame 40, a plurality of first LEDs 60, and a second LED 70, a first sealant 50 and a second sealant 48. Referring to FIG. 3, the frame 40 includes a base 42, a plurality of first bonding pads 44, and a plurality of second bonding pads 46, wherein the base 42 contains a first cavity 421 and a second cavity 422. As shown in FIG. 4, the second cavity 422 is disposed under the first cavity 421, and the second cavity 422 is smaller than the first cavity 421. In addition, the plurality of first bonding pads 44 is disposed in the bottom of the first cavity 421, and the plurality of second bonding pads 46 is disposed in the bottom of the second cavity 422. The plurality of first LEDs 60 is disposed in the bottom of the first cavity 421, wherein each of the plurality of first LEDs 60 comprises an anode 62 and a cathode 64, and the anode 62 and the cathode 64 are electrically connected to each of the plurality of first bonding pads 44, by wire-bonding or flip-chip, for example. The second LED 70 is disposed in the bottom of the second cavity 422, wherein the second LED 70 contains an anode 72 and a cathode 74, and the anode 72 and the cathode 74 are electrically connected to each of the plurality of second bonding pads 46, by wire-bonding or flip-chip, for example. Moreover, the second sealant 48 is filled in the second cavity 422 and covering the second LED 70, and the first sealant 50 is filled in the first cavity 421 and covering the plurality of first LEDs 60.

Figure 5:
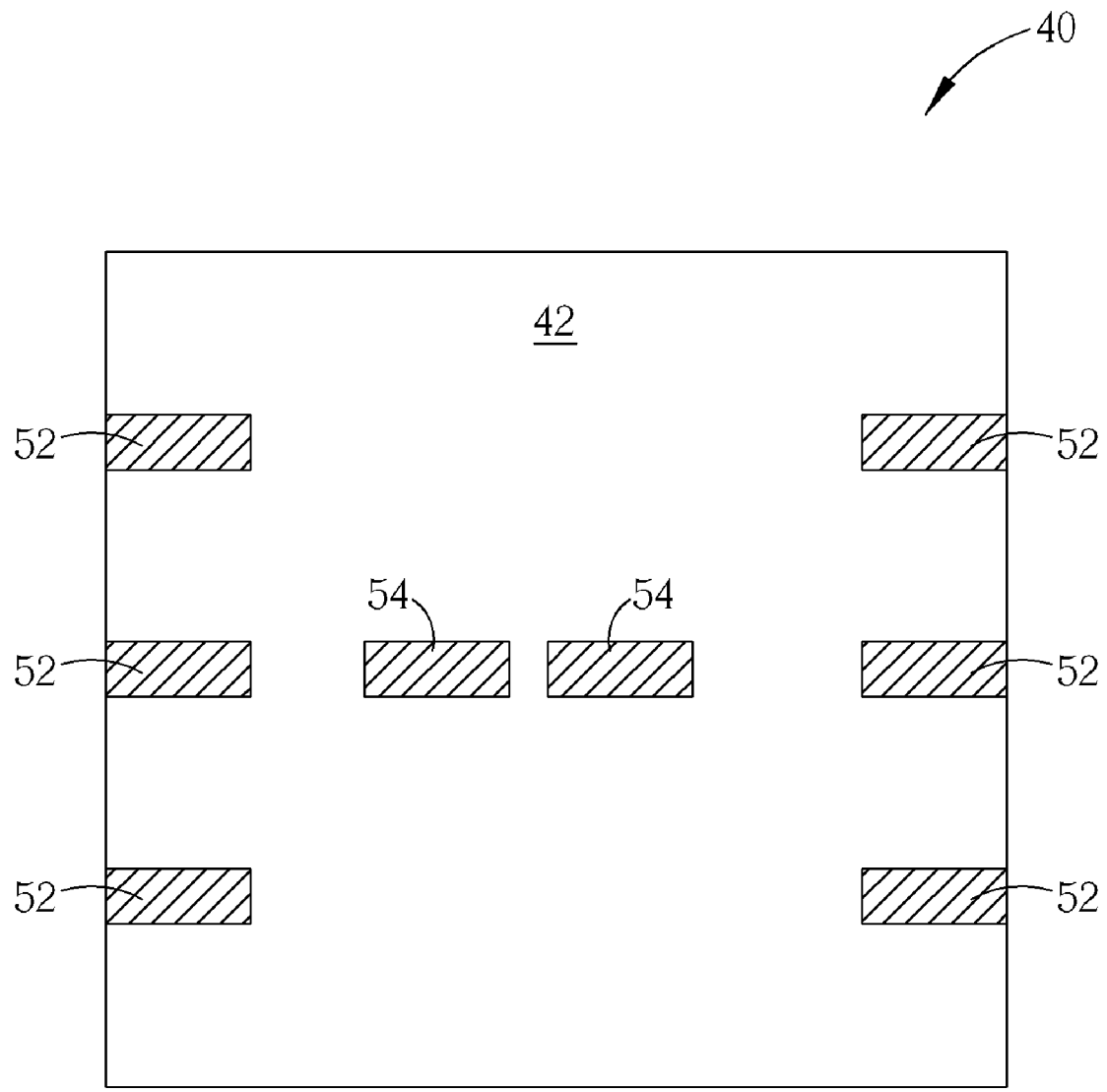
FIG. 5 is a bottom view showing an LED package structure according to a preferred embodiment of the present invention.

Referring to FIG. 5 as well as FIG. 4, the frame 40 further includes a plurality of first pins 52 and a plurality of second pins 54, wherein the plurality of first pins 52 are disposed in the base 42 and one end of each of the plurality of first pins 52 extends into the first cavity 421 and is electrically connected to each of the plurality of first bonding pads 44 correspondingly. The other end of each of the plurality of first pins 52 is exposed outside the base 42 for the anode 62 and the cathode 64 of each of the plurality of first LEDs 60 to be electronically connected externally via the plurality of first pins 52. Similarly, the plurality of second pins 54 are disposed in the base 42 and one end of each of the plurality of second pins 54 extends into the second cavity 422 and is electrically connected to each of the plurality of second bonding pads 46 correspondingly. The other end of each of the plurality of second pins 54 is exposed outside the base 42 for the anode 72 and the cathode 74 of the second LED 70 to be electronically connected externally via the plurality of second pins 54. In the present embodiment, a refractive index of the second sealant is higher than a refractive index of the first sealant 50. Thus, the light-emitting quantity of the second LED 70 will be increased according to Snell's Law, which will increase overall luminance of the LED package structure 30 accordingly. In addition, the first cavity 421 and the second cavity 422 preferably have inner walls ascending outwardly. Therefore, the light emitted from the plurality of first LEDs 60 and the second LED 70 can be reflected by the inner walls of the first cavity 421 and the second cavity 422 to improve the light utilization.

In the present embodiment, the base 42 is a base of the LED package structure 30, the material of the base may be a Polyphthalamide (PPA), an epoxy, or other insulating materials. The second sealant 48 and the first sealant 50 may be silicon or other moist-proof materials. A low-power LED can be selected for the plurality of first LEDs 60, such as the low-power LED whose electrical current is, but not limited to, substantially 20 mA (mili amper). The present embodiment uses a white-light LED package structure as an example so that the plurality of first LEDs 60 may include a low-power red light LED, a low-power green light LED, and a low-power blue light LED to produce white light by mixing red light, green light, and blue light, but is not limited to it. For example, the plurality of first LEDs 60 may also be a blue light LED, and a yellow fluorescent sealant can be selected for the first sealant 50 in this case to produce white light when the blue light LED irradiates the yellow fluorescent sealant. Alternatively, a high-power LED can be selected for the second LED 70, such as the high-power LED whose electrical current is, but not limited to, substantially 350 mA. For instance, a high-power blue light LED can be selected for the second LED 70, and a yellow fluorescent sealant can be selected for the second sealant 48 to produce white light when the blue light LED irradiates the yellow fluorescent sealant. There may be other embodiments of the present invention. For example, the second LED 70 may include a high-power red light LED, a high-power green light LED, and a high-power blue light LED to produce white light by mixing red light, green light, and blue light. In another embodiment, when the LED package structure 30 is a single-colored LED package structure, a low-power single-colored LED can be selected for the plurality of first LEDs 60, including a low-power blue light LED. In this case, a high-power single-colored LED can be selected for the second LED 70, such as a high-power blue light LED.

In the present embodiment, a high-power LED is selected for the second LED 70 in order to increase luminance and color purity of the LED package structure 30. However, the high-power LED may generate more heat compared to the low-power LED, which results in a much higher temperature of the high-power LED than the low-power LED. In view of the abovementioned problem, the plurality of first LEDs 60 and the second LED 70 are respectively installed in the bottoms of the first cavity 421 and the second cavity 422, wherein the first cavity 421 and the second cavity 422 are located in different domains. Thus, the heat generated by the second LED 70 can be conducted downwardly via the plurality of second bonding pads 46, which has a better thermal conductivity, rather than being conducted upwardly via the second sealant 48, which has a worse thermal conductivity. As a result, it can prevent the light-emitting efficiency of the plurality of first LEDs 60 from being affected by the heat generated by the second LED 70. On the other hand, the heat generated by the plurality of first LEDs 60 can be conducted outwardly via the plurality of first bonding pads 44, which has a better thermal conductivity, rather than being conducted downwardly via the second sealant 48, which has a worse thermal conductivity. It will therefore prevent the light-emitting efficiency of the second LED 70 from being affected by the heat generated by the plurality of first LEDs 60.

In summary, the LED package structure of the present invention provides a high-power LED and a low-power LED disposed in different domains. As a result, the heat generated by the high-power LED can be conducted downwardly via the bonding pads while the heat generated by the low-power LED can be conducted outwardly via the bonding pads to achieve a good heat-dissipation effect. Consequently, the light-emitting efficiency of the high-power LED and the low-power LED will be significantly improved due to its good heat-dissipation effect, which leads to high luminance and color purity of the LED package structure.

Those skilled in the art will readily observe that numerous modifications and alterations of the device and method may be made while retaining the teachings of the invention.

What is claimed is:

1. An LED package structure, comprising:
    a frame, comprising:
        a base having a first cavity and a second cavity, wherein the second cavity is disposed under the first cavity and the second cavity is smaller than the first cavity;
        a plurality of first bonding pads disposed in a bottom of the first cavity; and
        a plurality of second bonding pads disposed in a bottom of the second cavity;
    at least a first LED disposed in the bottom of the first cavity, the first LED comprising an anode and a cathode, the anode and the cathode being electrically connected to each of the plurality of first bonding pads correspondingly; and
    at least a second LED disposed in the bottom of the second cavity, the second LED comprising an anode and a cathode, the anode and the cathode being electrically connected to each of the plurality of second bonding pads correspondingly.

2. The LED package structure of claim 1, further comprising a second sealant filled in the second cavity and covering the second LED.

3. The LED package structure of claim 2, wherein the second sealant comprises a yellow fluorescent sealant.

4. The LED package structure of claim 3, wherein the second LED comprises a blue light LED.

5. The LED package structure of claim 2, further comprising a first sealant filled in the first cavity and covering the first LED.

6. The LED package structure of claim 5, wherein a refractive index of the second sealant is higher than a refractive index of the first sealant.

7. The LED package structure of claim 1, wherein the first LED comprises a low-power LED.

8. The LED package structure of claim 1, wherein the second LED comprises a high-power LED.

9. The LED package structure of claim 1, wherein the first cavity has an inner wall that inclines outwardly.

10. The LED package structure of claim 1, wherein the second cavity has an inner wall that inclines outwardly.

11. The LED package structure of claim 1, wherein the frame further comprises a plurality of first pins disposed in the base, and one end of each of the plurality of first pins extends into the first cavity and is electrically connected to each of the plurality of first bonding pads correspondingly while the other end of each of the plurality of first pins is exposed outside the base.

12. The LED package structure of claim 1, wherein the frame further comprises a plurality of second pins disposed in the base, and one end of each of the plurality of second pins extends into the second cavity and is electrically connected to each of the plurality of second bonding pads correspondingly while the other end of each of the plurality of second pins is exposed outside the base.

13. A frame, comprising:
- a base having a first cavity and a second cavity, wherein the second cavity is disposed under the first cavity and the second cavity is smaller than the first cavity;
- a plurality of first bonding pads disposed in a bottom of the first cavity;
- a plurality of second bonding pads disposed in a bottom of the second cavity;
- a plurality of first pins disposed in the base, wherein one end of each of the plurality of first pins extends into the first cavity and is electrically connected to each of the plurality of first bonding pads correspondingly while the other end of each of the plurality of first pins is exposed outside the base; and
- a plurality of second pins disposed in the base, wherein one end of each of the plurality of second pins extends into the second cavity and is electrically connected to each of the plurality of second bonding pads correspondingly while the other end of each of the plurality of second pins is exposed outside the base.

14. The frame of claim 13, wherein the first cavity has an inner wall ascending outwardly.

15. The frame of claim 13, wherein the second cavity has an inner wall ascending outwardly.

\* \* \* \* \*